United States Patent [19]

McLaughlin

[11] 3,881,157

[45] Apr. 29, 1975

[54] TWO-COUPLER MICROWAVE FREQUENCY DISCRIMINATOR WITH INTERNAL ADJUSTABLE DELAY LINE

[75] Inventor: Robert L. McLaughlin, Pompey, N.Y.

[73] Assignee: The United States of America as represented by the Secretary of the United States Air Force, Washington, D.C.

[22] Filed: Mar. 28, 1974

[21] Appl. No.: 455,768

[52] U.S. Cl. ................ 329/116; 325/316; 329/135; 329/145

[51] Int. Cl. ............................................ H03d 5/00

[58] Field of Search ........... 329/112, 116, 135, 147, 329/145, 160; 325/316, 445, 446; 179/15 BT; 307/233

[56] References Cited

UNITED STATES PATENTS

| | | | |
|---|---|---|---|
| 2,928,940 | 3/1960 | Ruthroff | 329/116 |
| 3,099,707 | 7/1963 | Dome | 179/15 BT X |
| 3,334,187 | 8/1967 | Pampel | 179/15 BT |
| 3,530,387 | 9/1970 | Bonfeld et al. | 329/116 |

*Primary Examiner*—Alfred L. Brody
*Attorney, Agent, or Firm*—Julian L. Siegel

[57] ABSTRACT

A two-coupler microwave frequency discriminator having an adjustable delay line. The signal to be demodulated is fed to one of the input ports of a 3 db coupler and its inphase output is fed to a fixed external delay while the quadrature output is fed to an internal adjustable delay line. The two delay circuits are fed to the input ports of a second 3 db coupler and the outputs thereof are connected one each to matched detecting diodes. A pair of video amplifiers are each fed by both diodes producing an amplified modulated signal and a frequency modulated signal. The internal adjustable delay line includes a pair of printed circuit boards opposing each other with one fixed in the housing and the other slidably mounted within the housing and driven longitudinally by an attached slide screw that protrudes to the outside of the housing.

2 Claims, 2 Drawing Figures

TWO-COUPLER MICROWAVE FREQUENCY DISCRIMINATOR WITH INTERNAL ADJUSTABLE DELAY LINE

BACKGROUND OF THE INVENTION

This invention relates to systems for demodulating microwave carrier frequencies, and more particularly to delay line discriminators.

Delay line discriminators capable of measuring the frequency modulation properties of signals with short durations have been available for a considerable time. These prior art discriminators have the disadvantage that in order to change the operating point new delay lines have to be cut and/or switched in to move the operating point to the desired location. This limited the practical utilization of the delay line discriminator technique to a few very special applications.

The present invention overcomes the disadvantages of the prior art discriminators and retains the inherent advantages of the delay line technique by using a two-coupler delay line discriminator with an internal adjustable delay line as well as an external fixed delay.

SUMMARY OF THE INVENTION

The two-coupler microwave frequency discriminator with internal adjustable delay line consists of two broadband microwave stripline, a pair of 3 db couplers, and a novel adjustable line stretcher integrated in one package. It also includes a fixed delay line and two matched detector diodes.

This discriminator permits continuous tuning in the frequency range of 2.0 gHz to 10.0 gHz. Other adjustable delay lines can be constructed to extend this tuning range.

It is therefore an object of this invention to provide a tunable wideband microwave frequency demodulator.

It is another object to provide a delay line discriminator that measures the frequency characteristics of signals with very short duration.

It is still another object to provide a delay line discriminator that can change the operating point without switching in new delays.

It is yet another object to provide a two-coupler delay line that permits continuous tuning in the frequency range of 2.0 gHz to 10.0 gHz.

These and other objects, advantages and features of the invention will become more apparent from the following description taken in connection with the illustrative embodiments in the accompanying drawings.

DETAILED DESCRIPTION OF THE PREFERRED EMBODIMENT

Figure 1:
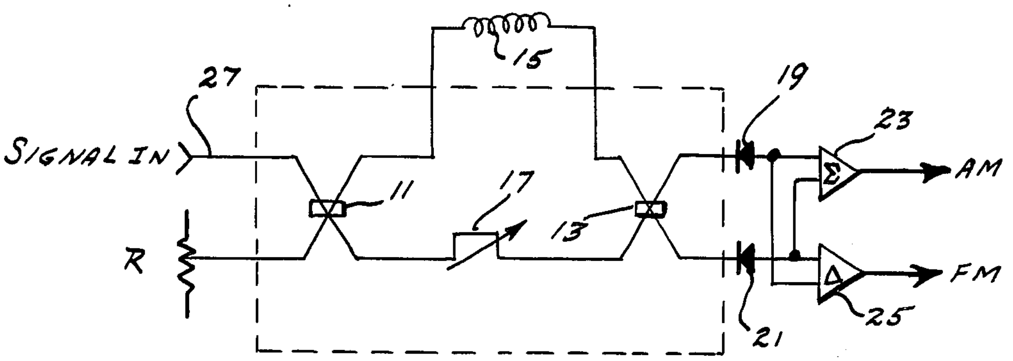
FIG. 1 is a schematic diagram of the embodiment of the invention.

Referring to FIG. 1, the discriminator includes broadband 3 db couplers 11 and 13, fixed delay line 15 which can be external to the unit, an adjustable internal delay line 17, two matched detector diodes 19 and 21, and two wideband video amplifiers 23 and 25.

The input signal is inserted in port 27 of 3 db coupler 11 and is split into two quadrature components. A 3 db coupler can be the junction of two waveguides having a common H wall and are coupled together by an H type aperture coupling. The inphase component of 3 db coupler 11 is passed through fixed delay line 15 while the quadrature component passes through internal adjustable delay line 17. The second input port of 3 db coupler 11 is terminated with resistance R. The delay signals are presented to the input ports of 3 db coupler 13. The two output ports of 3 db coupler 13 are fed to matched detector diodes 19 and 21. The detected video from both diodes is summed in video amplifier 23 to obtain amplitude modulation information and is subtracted in video amplifier 25 to obtain frequency modulation information.

Figure 2:
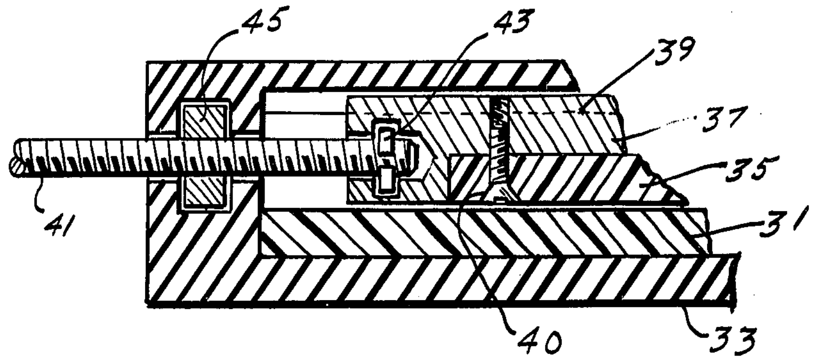
FIG. 2 is a cross-sectional view of the adjustable delay line used in the embodiment of FIG. 1.

Referring to FIG. 2, there is shown the detail of internal adjustable delay 17 of FIG. 1. This adjustable delay acts as a line stretcher by changing the position of a pair of opposing printed circuit boards. Fixed printed circuit board 31 is secured to housing 33 while movable printed circuit board 35 is attached to brass slide 37 and by screw 40. Brass slide 37 includes ridge 39 which is inserted in a groove at the top of housing 33 to guide brass slide 37. The assembly including guided brass slide 37 and printed circuit board 35 can be longitudinally driven in the opening formed by housing 33 by attaching and rotating slide screw 41. Slide screw 41 is secured to brass slide 37 by slide screw retaining clip 43. Nut 45 is used to rotate slide screw 41 and can be attached in a manner to fit tightly to prevent unwanted rotation.

What is claimed is:

1. A microwave frequency discriminator comprising:

a. a first transmission channel with first and second terminals and having an input signal source at the first terminal;

b. a second transmission channel with first and second terminals and having a resistance at the first terminal, the second transmission channel intersecting the first transmission channel at first and second intersection points;

c. a first 3 db coupler located at the first intersection point of the first and second transmission channels;

d. a second 3 db coupler located at the second intersection point of the first and second transmission channels;

e. an adjustable delay connected within the first transmission channel between the first and second intersection points;

f. a fixed delay connected within the second transmission channel between the first and second intersection points;

g. a first detecting diode connected to the second terminal of the first transmission channel h. a second detecting diode matched to the first detecting diode connected to the second terminal of the second transmission channel;

i. an adding video wideband amplifier fed by the first and second diodes producing an amplitude modulation output; and j. a subtracting video wideband amplifier fed by the first and second diodes producing a frequency modulated output.

2. A microwave frequency discriminator according to claim 1 wherein the adjustable delay comprises:

a. a housing;

b. a first printed circuit board fixedly mounted within the housing;

c. a second printed circuit board slidably mounted upon and opposing the first printed circuit board;

d. a slide screw having one extreme attached to the slidably mounted second printed circuit board for adjusting the position thereof by rotation by longitudinally driving the second printed circuit board in the housing.

* * * * *